United States Patent [19]

Ye et al.

[11] Patent Number: 5,753,137
[45] Date of Patent: May 19, 1998

[54] DRY CLEANING OF SEMICONDUCTOR PROCESSING CHAMBERS USING NON-METALLIC, CARBON-COMPRISING MATERIAL

[75] Inventors: Yan Ye, Campbell; Charles Steven Rhoades, Los Gatos; Gerald Z. Yin, Cupertino, all of Calif.

[73] Assignee: Applied Materials, Inc., Sunnyvale, Calif.

[21] Appl. No.: 786,406

[22] Filed: Jan. 21, 1997

Related U.S. Application Data

[60] Continuation of Ser. No. 442,904, May 17, 1995, abandoned, which is a division of Ser. No. 104,318, Aug. 9, 1993, Pat. No. 5,486,235.

[51] Int. Cl.$^6$ .............................. C09K 13/00; H01L 21/00
[52] U.S. Cl. ................................... 252/79.1; 438/905
[58] Field of Search ........................... 252/79.1; 134/1.2, 134/1.3, 21, 22.14, 22.19

[56] References Cited

U.S. PATENT DOCUMENTS

| | | | |
|---|---|---|---|
| 4,372,807 | 2/1983 | Vossen, Jr. et al. | 156/643 |
| 4,529,474 | 7/1985 | Fujiyama et al. | 156/643 |
| 4,664,939 | 5/1987 | Ovshinsky | 427/39 |
| 4,786,359 | 11/1988 | Stark et al. | 156/643 |
| 4,816,113 | 3/1989 | Yamazaki | 134/1.1 |
| 4,863,808 | 9/1989 | Sallo | 428/601 |
| 4,886,681 | 12/1989 | Clabes | 427/38 |
| 4,897,153 | 1/1990 | Cole et al. | 156/643 |
| 4,975,144 | 12/1990 | Yamazaki et al. | 216/81 |
| 5,017,264 | 5/1991 | Yamazaki et al. | 156/643 |
| 5,069,724 | 12/1991 | Kobayashi et al. | 216/75 |
| 5,085,727 | 2/1992 | Steger | 156/345 |
| 5,158,644 | 10/1992 | Cheung et al. | 156/643 |
| 5,201,990 | 4/1993 | Chang et al. | 156/643 |
| 5,202,291 | 4/1993 | Charvat et al. | 437/245 |
| 5,207,836 | 5/1993 | Chang | 134/1 |
| 5,329,569 | 7/1994 | Spielman | 378/161 |
| 5,331,203 | 7/1994 | Wojnarowski | 257/698 |
| 5,336,558 | 8/1994 | Debe | 428/323 |
| 5,356,478 | 10/1994 | Chen et al. | 134/1.1 |
| 5,391,516 | 2/1995 | Wojnarowski et al. | 437/174 |
| 5,417,826 | 5/1995 | Blalock | 204/176 |
| 5,418,007 | 5/1995 | Debe | 427/154 |
| 5,464,031 | 11/1995 | Buley et al. | 134/1 |

FOREIGN PATENT DOCUMENTS

663687 A1  7/1995  European Pat. Off.  ........ H01L 21/00

OTHER PUBLICATIONS

Kay, E. and A. Dilks, "Plasma Polymerization of Fluorocarbns in RF Capacitively Coupled Diode System", *J. Vac. Sci. Technol.* 18 (1) Jan./Feb. 1981, pp. 1–11.

Singer, Peter H., Assoc. Ed., "Today's Plasma Etch Chemistries", *Semiconductor International*, Mar. 1988, pp. 68–73.

Singer, Peter H., Assoc. Ed., "Plasma Etching of Metals", *Semiconductor International*, Mar. 1987, pp. 76–79.

*Primary Examiner*—R. Bruce Breneman
*Assistant Examiner*—Anita Alanko
*Attorney, Agent, or Firm*—Shirley L. Church

[57] ABSTRACT

In accordance with the present invention, the plasma dry cleaning rate of semiconductor process chamber walls can be improved by placing a non-gaseous dry cleaning enhancement material in the position which was occupied by the workpiece during semiconductor processing. The non-gaseous dry cleaning enhancement material is either capable of generating dry cleaning reactive species and/or of reducing the consumption of the dry cleaning reactive species generated from the plasma gas feed to the process chamber.

When process chamber non-volatile contaminant deposits are removed from plasma process chamber surfaces during plasma dry cleaning by placing a non-gaseous source of reactive-species-generating material within the plasma process chamber, the non-gaseous source of reactive-species-generating material need not be loacted upon or adjacent the workpiece support platform; however, this location provides excellent cleaning results in typical process chamber designs.

12 Claims, 5 Drawing Sheets

DRY CLEANING OF SEMICONDUCTOR PROCESSING CHAMBERS USING NON-METALLIC, CARBON-COMPRISING MATERIAL

This application is a Continuation, of prior U.S. application Ser. No. 08/442,904, filed on May 17, 1995 now abandoned, which is a divisional application of application Ser. No. 08/104,318, filed on Aug. 9, 1993 and issued as U.S. Pat. No. 5,486,235.

BACKGROUND OF THE INVENTION

1. Field of the Invention

The present invention pertains to a method and apparatus for plasma cleaning of semiconductor processing chambers.

2. Description of the Background Art

Semiconductor processing involves a number of different chemical and physical processes whereby minute integrated circuits are created on a substrate. The integrated circuits are constructed using multilayers of interrelated patterns of various materials; layers of material are created by chemical vapor deposition, physical vapor deposition, and epitaxial growth. Some of the layers are patterned using photoresist masks and wet and dry etching techniques. Patterns are created within layers by the implanting of dopants at particular locations. (The substrate upon which the integrated circuit is created may be silicon, gallium arsenide, glass, or any other appropriate material). Many of the processes carried out within semiconductor processing reactors leave contaminant deposits on the walls of the process chamber which accumulate and become the source of particulate matter harmful to the creation of a semiconductor device. As the dimension size of the semiconductor device has become ever smaller, the presence of particulate matter upon the surface of the semiconductor workpiece has become ever more critical.

Contaminant deposit buildup on semiconductor process chamber walls can be particularly significant when metal etching processes are carried out in the chamber. In particular, the etching of an aluminum pattern produces relatively large accumulations of such contaminant buildup. For example, during experimental plasma etching of aluminum upon the surface of a semiconductor workpiece, under disadvantageous conditions, etching of 25 ea. 8 in. diameter silicon wafer substrates produced an average contaminant layer thickness of about 1 micron built up on the walls of the etch processing chamber. The contaminant deposit thickness was greatest on the etch chamber walls and gas distribution plate which were in contact with the active plasma; the etch chamber had a diameter of about 15 in. and a height of about 8 in.

Contaminants can be removed from the walls of the processing chamber and the gas distribution plate by dry cleaning using plasma-enhanced etching, or the processing chamber surfaces can be opened and wet cleaned manually. This latter procedure for removing contaminants from the processing chamber wall is very time consuming.

U.S. Pat. No. 5,207,836 to Chang et al., issued May 4 1993, describes a cleaning process for removal of deposits from the susceptor of a chemical vapor deposition apparatus. The process is recommended for the removal of deposits such as tungsten or tungsten silicide from a susceptor in a vacuum deposition chamber. To avoid leaving fluorine residues in the deposition chamber, after a gaseous source of fluorine is used in the plasma cleaning of the chamber, a gaseous source of hydrogen is fed into the chamber (while the plasma is maintained) to remove any fluorine residues from the chamber. Examples of fluorine-containing gases recommended for the dry cleaning include $SF_6$, $CF_4$, $C_2F_6$, and $NF_3$. The gaseous source of fluorine may further include inert or non-reactive gases such as argon, neon, or helium.

U.S. Pat. No. 5,202,291 to Chavrat et al., issued Apr. 13, 1993, describes a method for anisotropically reactive ion etching aluminum and aluminum alloys. The plasma is comprised of a chlorinated and a carbon-containing gas mixture wherein the chlorinated gas provides the etching and the carbon-containing gas reacts to provide an inhibiting layer along the side wall of the aluminum layer. The plasma gas mixture is such that the ratio of carbon atoms to chlorine molecules results in an unexpected increase in the etch rate of the aluminum.

U.S. Pat. No. 5,158,644 to Cheung et al., issued Oct. 27, 1992, discloses a reactor chamber self cleaning process recommended for CVD (chemical vapor deposition) and PECVD (plasma-enhanced chemical vapor deposition) process chambers. The cleaning process can be used for both wide area cleaning of the chamber components and exhaust system components, as well as for local cleaning of the gas distribution manifold and RF electrodes. The self cleaning can be conducted when the process chamber is empty or may be used as an integral step during the processing of a substrate in particular cases. In particular, a process is described wherein dielectric coatings such as silicon oxide are deposited on a semiconductor wafer, after which self-cleaning is carried out in the reactor with the semiconductor wafer still present in the reactor. Obviously, a semiconductor wafer surface composition other than silicon oxide, which would be harmed by the self-cleaning process, cannot be left in the process chamber during the self-cleaning process.

When wide area cleaning is carried out, typical process conditions used for a CVD process chamber having a volume of approximately 5.5 gal. (about 21 liters) include use of $C_2F_6$ gas at a flow rate of about 300 to 1,200 sccm, $O_2$ gas at a flow rate of about 400–950 sccm, pressure of about 0.8 to 2 Torr, electrode spacing of about 1,000 mils and RF power density of about 2.7–5.6 watts/cm². When local area cleaning is carried out, typical process conditions include a $C_2F_6$ flow rate of about 600–950 sccm, an $O_2$ flow rate of about 700–1,000 sccm, electrode spacing of about 180–350 mils, pressure of about 6–13 torr and a power density of about 2.7–5.6 watts/cm².

U.S. Pat. No. 5,085,727 to R.J. Steger, issued Feb. 4, 1992, discloses an improved plasma etching apparatus comprising an etch chamber having inner metal surfaces coated with a conductive coating capable of protecting such inner metal surfaces from chemical attack by reactant gases such as halogen-containing gases used in the chamber during the plasma etching processes. In a preferred embodiment, a carbon coating at least about 0.2 micrometers is formed on the inner metal surfaces of the etch chamber by a plasma assisted CVD process using a gaseous source of carbon and either hydrogen or nitrogen or both. The conductive coating material is said to comprise a material selected from the group consisting of carbon, titanium nitride, indium stannate, silicon carbide, titanium carbide and tantalum carbide.

U.S. Pat. No. 4,786,359 to Stark et al., issued Nov. 22, 1988, describes a plasma etch process and apparatus in which silicon wafers are etched using a plasma-assisted gas mixture comprising $CF_3Br$ and xenon or krypton. The use of $CF_3Br$ is said to cause the deposition of polymeric material in the plasma reactor. The polymer formation is said to change the electrical characteristics of the chamber as well as the chemistry of the process being performed therein. Further, the polymer coating formed is said to become a source of particle contamination on the wafer. To solve this problem, Stark et al. added, within the chamber, a sacrificial structure which erodes during the etch process to prevent polymer buildup in the reactor chamber. The sacrificial structure is described as a carbon bearing object. In particular, the carbon bearing material is said to be an organic compound or graphite. High temperature plastics are said to appear to be suitable as carbon-bearing materials; of the high temperature plastics, polyarylates are said to etch more quickly than polyimides so that polyimides re preferred for use. Graphite, a graphite compound or a graphite-coated ceramic are given as preferred carbon-bearing materials.

Descriptions of the interrelationship between plasma etching and plasma polymerization, with emphasis on the plasma-surface interactions leading to polymerization are presented in "Plasma Polymerization of Fluorocarbons in RF Capacitively Coupled Diode System" by E. Kay and A. Dilks, *J. Vac. Sci. Technol.* 18 (1) January/February 1981. Further description of the use of fluorine and chlorine containing gases in plasma etching is provided in "Today's Plasma Etch Chemistries", Peter H. Singer, Associate Editor, *Semiconductor International*, March 1988. These articles make it clear that the development of a successful etch chemistry requires a careful selection of input gas composition as well as careful control of the process variables, including gas flow rate, chamber pressure and temperature, plasma energy and system configuration. Typically, the etch process must be tailored to the particular material to be etched (with process parameters being adjusted within predictable ranges in view of the particular system configuration).

Some of the U.S. patents referred to above describe the "dry" cleaning of semiconductor process chambers using plasmas. Other patents and the papers cited above describe the use of carbon-containing materials in gas plasma reactions to: polymerize on the side walls of etched aluminum under glow discharge conditions, preventing the undercutting of aluminum side walls during aluminum plasma etching; to prevent the build up of polymeric materials on the wall of the plasma chamber during the etching of silicon wafers; and provide a carbon coating on the walls of plasma chambers which protects the chamber walls from attack by halogen-containing gases during plasma etching processes. Although the functional behavior of the carbon-containing materials appears to be somewhat inconsistent in view of the descriptions provided in the patents, it is readily apparent that the carbon-containing materials react under plasma glow discharge conditions to form various chemical compounds such as polymers. These chemical compounds affect other process variables within the plasma-assisted process being carried out within the semiconductor process chamber.

As previously described, there is an interest in reducing the amount of time required for plasma cleaning of reactor chambers. The build up of contaminant deposits on the walls of plasma process chambers occurs to some extent during most plasma processes, but is particularly acute in metal etch processes. During chlorine-based metal etching of aluminum, for example, the aluminum reacts with chlorine molecules and atoms to form volatile aluminum chloride; some of this metal etch byproduct is pumped out of the plasma process chamber by applied vacuum. However, some of the chlorine species react with organic species from patterning photoresist and/or other organic sources within the reactor to form non-volatile materials which are deposited on the walls of the plasma process chamber. As increasing numbers of substrates are processed, the contaminating deposits on the process chamber wall increase in thickness and eventually begin to flake off due to thermal expansion and contraction of the processing equipment, and in some cases due to reactions with moisture; this flaking off of contaminants leads to particulate contamination of substrates being processed within the chamber.

The contaminating deposits on plasma process chamber walls can be removed in a plasma either by ion bombardment or by chemical reaction. Since the plasma chamber wall is normally electricdlly grounded, the ion bombardment (sputtering effect) upon the chamber wall itself is generally not very effective, and chemical reaction is preferred for cleaning process chamber surfaces. The most preferred way to remove the contaminant deposits using a chemical reaction is to convert the deposits to a volatile species which can be vacuum pumped from the plasma process chamber. Thus, it is desired to provide a method of dry cleaning plasma process chambers, particularly metal etch chambers, which converts contaminant deposits on the surfaces of the process chamber to volatile species which can be easily removed from the process chamber.

SUMMARY OF THE INVENTION

In accordance with the present invention, non-volatile contaminant deposits are removed from plasma process chamber surfaces during plasma dry cleaning by placing a non-gaseous source of reactive-species-generating material within the plasma process chamber during the plasma dry cleaning. The source of non-gaseous reactive-species-generating material is present within the chamber and consumed over time rather than added to the chamber from an outside supply during the plasma dry cleaning. This presence of the source within the chamber makes it possible to generate the reactive species to be used in cleaning more rapidly. Reactive species generation occurs upon exposure of the source to an appropriate plasma. Preferably, the source of the reactive-species-generating material is in the form of a disk or rectangular-shaped sheet which, during plasma dry cleaning of process chamber surfaces, occupies the space typically occupied by a workpiece during semiconductor processing.

The non-gaseous reactive-species-generating source may be a solid disk or sheet of material; may be a substrate having a coating of the reactive-species-generating material thereon; or may be a liquid contained in a solid support structure.

The non-gaseous reactive-species-generating material comprises at least one component which, under the process conditions used in plasma dry cleaning, becomes a volatile, reactive specie and migrates to the surfaces of the plasma processing chamber where it acts upon at least one contaminant deposit whereby a volatile component is produced. The volatile component may be generated by a reaction or by the energy imparted upon physical contact of the reactive species with the contaminant deposit.

When the plasma etching of aluminum is carried out in the plasma processing chamber, at least a portion of the non-volatile contaminant deposits found on the chamber walls are in the form of $Al_xCl_y$, wherein x and y are numbers ranging from about 1 to about 5. Generally, the nonvolatile contaminant deposits include polymeric materials formed due to the presence of various elements such as, for example, carbon, boron, nitrogen and hydrogen within the etch chamber during the plasma etching.

The non-gaseous reactive-species-generating material used in this instance must be one capable of generating a volatile reactive species capable of migrating to the plasma process chamber surfaces where the reactive species acts upon the contaminant deposits to convert previously involatile compounds, such as involatile aluminum-containing compounds, for example, to volatile compounds. These involatile compounds are converted to volatile compounds under the plasma dry cleaning process conditions.

It has been discovered that organic, carbon-containing compounds can, under plasma exposure, generate volatile reactive species capable of migrating to process chamber surfaces and converting previously involatile aluminum-containing compounds to volatile aluminum-containing compounds. For example, and not by way of limitation, it has been discovered that polymeric materials such as photoresist compositions can be converted to volatile reactive species under plasma conditions of the kind useful in plasma dry cleaning. Other carbon-containing materials which have been demonstrated to form volatile species useful in plasma dry cleaning include, not by way of limitation, polymers generated using $CHF_3$ as a starting material and Kapton® Type 100 HN Film, a polyimide available from DuPont Company.

Prior to the present invention, plasma dry cleaning of contaminated metal etch chambers was so slow that other cleaning methods were typically used. The present invention provides a rapid method of plasma dry cleaning of the surfaces within a semiconductor processing chamber having involatile contaminants deposited thereon. The method of the present invention comprises the steps of:

(a) placing a non-gaseous source of reactive-species-generating material within the processing chamber, the source being adequate to provide reactive species generation for at least one complete plasma cleaning operation;

(b) exposing the non-gaseous source of reactive-species-generating material to a plasma generated from a gas fed into the process chamber, whereby volatile reactive species are generated; and (c) contacting surfaces of the processing chamber with a plasma comprising the volatile reactive species generated in step (b) from the non-gaseous source, whereby at least a portion of the involatile contaminants on the surfaces are converted to volatile molecules.

Preferably, the step (b) plasma produced from the gas fed into the process chamber is also capable of acting upon at least one of the contaminants on the process chamber surfaces, to produce a volatile compound.

In the past, attempts have been made to dry clean plasma chambers using a plasma generated from a gas fed into the process chamber as the sole source of the reactive species used for chamber cleaning. When the dry cleaning was in progress, it was necessary to protect the substrate (workpiece) support platform (and underlaying functional elements) from the reactive species. To provide protection, in the case of a semiconductor wafer workpiece, a bare (uncoated and unprocessed) silicon wafer was typically used to protect the workpiece support platform. As previously described, the cleaning process was so slow as to be impractical. It has been discovered that if the silicon wafer used to protect the workpiece support platform is coated with a photoresist or a polymeric film such as Kapton®, the dry cleaning of the process chamber walls, using plasma-generated reactive species from a gas fed into the process chamber, is accelerated to the extent that plasma cleaning of the chamber walls becomes practically feasible. Applicants believe that this improvement in cleaning rate may be attributable to either the generation of reactive species from the coating applied to the silicon wafer and/or to a reduced consumption of the gas feed plasma-generated reactive species at the surface of the coated silicon wafer.

Thus, the rate of plasma cleaning of semiconductor process chamber walls can be improved by using the proper material to protect the workpiece support platform and can be improved even further when the material used to protect the workpiece support platform is also capable of generating reactive species which can assist in the cleaning process.

When the contaminant deposits include a metallic element, the material used to protect the workpiece support platform (and preferably to generate reactive species) is preferably a carbon-containing material. When the contaminant deposits include aluminum, the carbon-containing material is preferably a polymeric material.

The present invention also pertains to a method of determining whether a support platform protective material and/or potential reactive-species-generating source is capable of enhancing the rate at which semiconductor process chamber contaminant buildup is converted into volatile molecules, the method comprises the steps of:

(a) providing a potential protective material for said support platform or a non-gaseous potential reactive species generation source;

(b) placing the protective material for said support platform and/or said non-gaseous potential reactive species generation source in a proper position for evaluation within a chamber containing surfaces which exhibit the contaminant buildup;

(c) exposing the process chamber and contents therein to a plasma generated from a gas fed into the chamber; and (d) using optical emission spectra techniques to monitor volatile molecules adjacent the contaminant buildup surfaces during the plasma exposure.

This method enables the accumulation of data for the gas composition adjacent chamber surfaces during plasma cleaning. This data can be compared with a standard gas composition which is indicative of the kinds of volatile components generated at the chamber surface when the chamber surface is releasing the previously involatile contaminating deposits. The higher the optical emission spectra indication for volatile contamination components, the more functional support platform protective material and/or the reactive-species-generating source.

The present invention also pertains to the composition of matter of a source of reactive-species-generating material useful in the removal of metal-comprising contaminants from the surface of a semiconductor processing chamber, the composition of matter comprises: a carbon-containing material which is a liquid or a solid under standard conditions of about 25° C. and atmospheric pressure, and which is capable of generating a volatile reactive species upon exposure to a plasma, which volatile reactive species acts upon involatile organo-metallic compounds to render at least a portion of them volatile. Preferably the source of reactive-species-generating material is in a form which can occupy the space typically occupied by a workpiece in a semiconductor processing chamber. Most preferably, the source of reactive-species-generating material is a solid disk or sheet, or is a coating upon a solid disk or sheet.

The composition of matter of the support platform protective material can be a liquid or solid under the conditions described above, but need not be capable of generating reactive species. Of course, protective materials capable of generating reactive species useful in chamber wall cleaning are preferred.

DETAILED DESCRIPTION OF THE PREFERRED EMBODIMENTS

Figure 1:
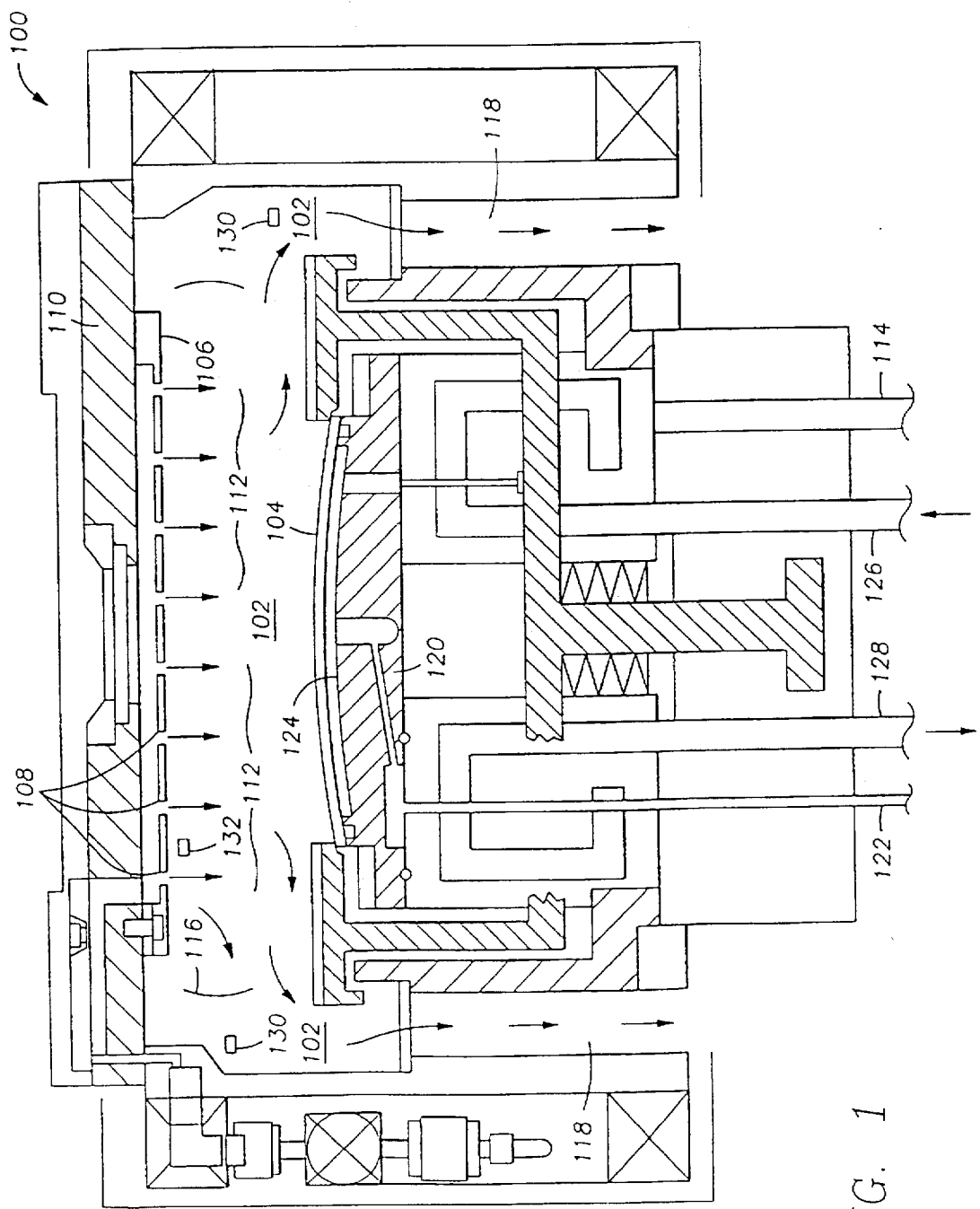
FIG. 1. schematically illustrates a plasma processing chamber of the kind typically used in etching of semiconductor substrates.

The present invention pertains to a method, apparatus, and composition of matter useful in plasma "dry" cleaning of semiconductor processing chambers. The invention is particularly useful for cleaning processing chambers having surfaces covered with contaminants which include metal-comprising molecules. The process is described in the preferred embodiments, which follow, in terms of the removal of organo-metallic contaminants and particularly organo-metallic materials comprising aluminum and alloys thereof. However, the concepts of: 1) using a non-volatile source of reactive-species generating material internal to the process chamber, where it is activated by contact with a plasma, to improve the removal of contaminants from chamber surfaces; and 2) using a workpiece support platform protective material which enhances the cleaning activity of the reactive plasma species at the process chamber wall are applicable to semiconductor process chambers in general. Contaminant removal is important for chambers used for chemical vapor deposition, physical vapor deposition, epitaxial growth, and dopant implantation, for example, as well as for chambers used in metal etching.

In cases when the chamber wall contaminant composition is not of the kind described in the preferred embodiments below, the source of reactive-species-generating material will need to be adjusted to generate the proper reactive specie. This can be done with minimal experimentation using the method for evaluating potential reactive-species-generating sources described in the Summary of Invention above. That method is described in more detail subsequently.

The plasma etching of metal-containing materials deposits a number of solid, involatile contaminants upon the walls of the processing chamber. Plasma dry cleaning techniques known prior to the present invention have not been as efficient as desired in the removal of these involatile contaminants. Cleaning of the chamber can require from about 5% to 10% of the available workpiece processing time for the chamber. Further, the chamber walls typically retained a level of residual contaminants after plasma cleaning which permitted a more rapid build up of additional contaminants once semiconductor processing was resumed.

Typical plasma-assisted aluminum etch chemistry utilizes process gases including $BCl_3$, $Cl_2$, and $N_2$ for example. During a chlorine-based aluminum etch process, aluminum on the substrate reacts with chlorine atoms and possibly with chlorine-comprising molecules to form volatile aluminum chloride-comprising molecules. Some of this etch byproduct is pumped out of the chamber, while some reacts with or associates with organic species from patterning photoresists or with other reactive species in the process chamber to form non-volatile materials, many of which are deposited on the process chamber surfaces. Typical composition data for contaminant deposits of this kind was determined as described below.

EXAMPLE 1

This example provides a description of the general composition of contaminant deposits formed on the surfaces of a metal-etch processing chamber when the workpiece being etched is a silicon wafer overlaid with an aluminum layer which is further overlaid with a patterned photoresist comprising a phenol formaldehyde novalak resin with a diazoquinone sensitizer. The etch plasma was formed from the following gases, each flowing at approximately 50 sccm: $BCl_3$, $Cl_2$, and $N_2$. The power applied ranged between about 500 and 800 W, process chamber pressure ranged between about 200 and 600 mT, the operational cathode temperature was about 80° C., while the chamber wall temperature was about 45° C.

FIG. 1 shows a schematic of an etch chamber 100 having a plasma chamber 102 wherein workpiece (substrate) 104 is processed. Etchant gases enter plasma chamber 102 through gas diffusion plate 106 openings 108. Gas distribution plate 106 is attached to etch chamber 100 lid 110. A plasma is generated in area 112 of plasma chamber 102 by the action of an RF charge entering etch chamber 100 at location 104. The outer boundaries 116 of plasma area 112 depend on the operating parameters (previously discussed) of etch chamber 100. The etch gases exit plasma chamber 102 through conduits 118 in response to an applied vacuum (not shown). Substrate 104 can be heated and cooled during processing. Substrate 104 is heated by heating substrate support platform 120 and passing a heat conducting inert gas 122 between the lower surface substrate 104 and the upper surface 124 of support platform 120. Substrate 104 can be cooled by passing cooling water through conduits adjacent support platform 120, where the water enters through conduit 126 and exits through conduit 128. To evaluate contaminant buildup on plasma chamber 102 surfaces, test specimens 130 were attached in the area of plasma chamber 102 walls and test specimens 132 were attached in the area adjacent gas distribution plate 106.

Contaminant deposit compositional data was collected at the FIG. 1 locations shown for test specimens 130 and 132. The contaminant buildup was prepared as described above. The data showed the presence (in atomic percent units for the elements detected) of from about 10% to about 30% aluminum; about 2% to 4% silicon; about 1% to 4% boron; about 8% to 20% chlorine; about 7% to 40% carbon; about 3% to 40% nitrogen; and about 20% to about 40% oxygen, with minor or trace amounts of other elements. Some of the oxygen measured may have been the result of oxygen contacting the surface of the contaminant deposit buildup upon opening of the process chamber.

Binding energies and atom percentages for a typical contaminant deposit taken from test specimens 130 attached adjacent the wall area in plasma chamber 102 are provided below in Table 1.

TABLE 1

High resolution ESCA data: Binding energies, atom percentages and peak assignments. (Binding energies were corrected to the binding energy of the —(CH$_2$)$_n$— signal at 284.6 mV. Atom percentages were calculated from the high resolution data. Peak assignments were based on the binding energies of reference compounds.

| Sample Description | Al$_1$ | Si$_1$ | B$_1$ | Cl$_1$ | Cl$_2$ | *Cl$_3$ | C$_1$ | C$_2$ | C$_3$ | N$_1$ | N$_2$ | N$_3$ | O$_1$ | O$_2$ | F$_1$ |
|---|---|---|---|---|---|---|---|---|---|---|---|---|---|---|---|
| PATTERNED WAFERS, ETCHED AT 60° C., CONTAMINANT DEPOSIT SCRAPED FROM CHAMBER WALL | | | | | | | | | | | | | | | |
| Binding energy (eV) | 75 | — | 192 | — | 198 | 201 | 285 | 286 | 288 | 399 | 400 | — | 531 | 533 | 639 |
| $^1$Atom percentage | 7 | — | 1 | — | 3 | 5 | 38 | 11 | 7 | 2 | 3 | — | 11 | 12 | 1 |

Peak Assignments:
Al$_1$ = A$_2$O$_3$, Al$_x$O$_y$  
Cl$_1$ = Cl$^-$  
C$_1$ = C—R  
N$_1$ = NR$_3$  
O$_1$ = metal oxide, C=O, C—O Si$_1$ = SiO$_2$  
Cl$_2$ = Cl$^-$  
C$_3$ = C—OR, C—Cl  
N$_2$ = NR$_3$  
O$_2$ = C=O, C—O B$_1$ = B$_x$O$_y$  
Cl$_3$ = C—Cl  
C$_3$ = C—C—OR  
N$_3$ = NR$_3$  
F$_1$ = C—F Binding energies and atom percentages for a typical contaminant deposit taken from test specimens 132 attached adjacent the anodized aluminum surface of the gas distribution plate 106, located directly above the substrate being etch processed, are provided in Table 2 below. The contaminant buildup was prepared as described above.

Further, prior to scraping off contaminant for analysis, an attempt was made to plasma clean the contaminant off gas distribution plate 106 using an O$_2$/SF$_6$ plasma. The cleaning plasma was generated from 25 sccm SF$_6$ and 250 sccm O$_2$, 800 W, at 200 mT, with the chamber wall surface at about 65° C. The cleaning process was not helpful in removing contaminants. In fact, a comparison of the data in TABLE 1 with the data in TABLE 2 shows that when a fluorine-containing plasma cleaning gas is used, non-volatile aluminum fluoride compounds are formed which build up on process chamber surfaces. As a result, when a fluorine-containing cleaning gas is used, the contaminants deposited on process chamber surfaces have a much higher aluminum content.

species compound with a "reactive species" capable of disrupting the van der Waals forces or the dipole-dipole interaction.

The amount of "reactive species" used to remove the contaminant from the process chamber surface may be very important in achieving the best cleaning result. For example, it is desirable to have enough reactive species to disrupt the binding forces or to reactively attack and break a covalent bond on the aluminum-comprising compound which forms the contaminant, but not so much reactive species that other involatile aluminum-comprising compounds may be formed.

EXAMPLE 2

During development of the present improved plasma dry cleaning process for aluminum etch process chambers, two kinds of dry cleaning plasmas were evaluated, those using oxygen-based chemistry and those using chlorine-based chemistry. For example, cleaning plasmas were created which included O$_2$ and SF$_6$. Although contaminant deposits

TABLE 2

High resolution ESCA data: Binding energies, atom percentages and peak assignments. (Binding energies were corrected to the binding energy of the —(CH$_2$)$_n$— signal at 284.6 mV. Atom percentages were calculated from the high resolution data. Peak assignments were based on the binding energies of reference compounds.

| Sample Description | Al$_1$ | S$_1$ | C$_1$ | C$_2$ | C$_3$ | N$_1$ | N$_2$ | O$_1$ | O$_2$ | F$_1$ | F$_2$ |
|---|---|---|---|---|---|---|---|---|---|---|---|
| PATTERNED WAFERS ETCHED AT 60° C., FOLLOWED BY O$_2$/SF$_6$ PLASMA DRY CLEANING OF CHAMBER | | | | | | | | | | | |
| Binding energy (eV) | 76 | 170 | 285 | 286 | 289 | 400 | 402 | 533 | 534 | 485 | 687 |
| Atom percent | 19 | 0.8 | 14 | 4 | 3 | 1 | 1 | 5 | 3 | 11 | 35 |

Peak Assignments:
Al$_1$ = ALF$_x$  
C$_2$ = C—OR$_1$, C—R  
N$_2$ = N—R$_4^+$  
F$_1$ = ionic F S$_1$ = SO$_x$  
C$_3$ = O=C—OR  
O$_1$ = C=O  
F$_2$ = ionic F

C$_1$ = C—R(R = C, B)  
N$_1$ = NR$_3$  
O$_2$ = C—O

The bonding structure of aluminum suggests that at least a portion of the aluminum-containing etch byproduct may not undergo a complex organometallic reaction with organic species during etch. Since the dipole moments of an aluminum chloride molecule and many organic molecules are high (due to an uneven distribution of electrons), it is quite possible that aluminum chloride molecules are fastened to organic species by van der Waals forces or by dipole—dipole interaction. To remove the aluminum-containing contaminant from the surface of the process chamber, then, would require contacting of the aluminum chloride/organic were removed from some locations within the process chamber, the results obtained with this oxygen—fluorine based chemistry were not as good as results obtained using the chlorine-based chemistry. The decision was made to concentrate on the use of plasmas generated from chlorine-comprising gases and nitrogen, used in combination with the source of reactive-species-generating material located internally within the plasma chamber.

This Example describes techniques used to select the proper chemical composition of the plasma generating gases, the process chamber pressure and the RF power to achieve improved dry cleaning of the etch plasma chamber.

(A constant operational wall temperature of about 65° C. was maintained). The workpiece support platform within the aluminum etch chamber was protected using a potential source of reactive-species-generating material, an 8 in. diameter silicon wafer having its upper, exposed surface coated with Shipley 1400-33® photoresist. This photoresist is composed of 33 percent solids prior to spin and bake, with at least 98% of the solvent carrier being removed during bake. The photoresist resin is a novalac phenol formaldehyde, the sensitizer is a diazoquinone, and the solvent is cellosolve acetate (80%), N-butyl acetate (10%) and xylene (10%).

Table 3, below, shows the results of changing various parameters within the dry cleaning process. This investigation was made using a clean plasma chamber so that process parameters which tended to cause contaminant buildup on plasma chamber surfaces would become apparent and could be avoided during plasma dry cleaning of etch chambers. If heavy polymer deposition was observed from the etch chamber window, the process was terminated after 10 minutes. If heavy buildup was not observed, the process was terminated after 15 minutes.

of process chamber 100 shown in FIG. 1, under the same plasma process conditions and for the same cleaning time period, presence of the photoresist-coated silicon wafer during plasma cleaning produced an 8 in. diameter of clean gas distribution plate, whereas presence of the $SiO_2$-coated silicon wafer produced only a 5 in. diameter of clean gas distribution plate. In particular, the process conditions used were 80 sccm $BCl_3$; 80 sccm $Cl_2$, 800 W, 600 mT and a wall operational temperature of about 65° C.

Enhancement of the cleaning process was also observed when a silicon wafer coated with Kapton® Type 100 HN polyimide film (1 mil) or with a $CHF_3$ derived polymer was used as a source of reactive species generation during plasma cleaning of the process chamber. Although one particular polyimide film was evaluated, it is expected that other polyimide films of similar composition and molecular weight will function as well. The Type 100 HN polyimide film exhibits a second order glass transition between 360° C. and 410° C. and the limiting oxygen index is 37% per ASTM D-2863-77.

EXAMPLE 4

To measure the relative efficiency of various potential reactive-species-generating sources, a test method was

TABLE 3

| $BCl_3$ (sccm) | $Cl_2$ (sccm) | $N_2$ (sccm) | Power (W) | Pressure (mT) | Polymer on Lid | Polymer on Body | Polymer on Kit* |
|---|---|---|---|---|---|---|---|
| 0 | 200 | 0 | 800 | 600 | no | no | no |
| 0 | 80 | 0 | 800 | 200 | no | very light[1] | no |
| 0 | 200 | 0 | 500 | 50 | no | no | light |
| 50 | 50 | 50 | 800 | 200 | very heavy[2] | very heavy[2] | very heavy[2] |
| 50 | 50 | 50 | 800 | 600 | very heavy[2] | very heavy[2] | very heavy[2] |
| 50 | 50 | 0 | 800 | 200 | light[3] | light[3] | light[3] |
| 50 | 50 | 0 | 800 | 600 | no | no | no |
| 0 | 50 | 50 | 800 | 200 | light[4] | light[3] | light[4] |
| 0 | 80 | 20 | 800 | 200 | light[4] | light[4] | light[4] |
| 0 | 200 | 20 | 800 | 600 | no | no | no |
| 0 | 200 | 20 | 500 | 50 | no | no | light |

[1]The material deposited on the chamber walls could not be visually observed. Presence of the deposit was determined by wiping the chamber with water; a slight yellow stain was found on the wet wiping cloth.
[2]The deposited material was transparent in color and did not flake. The polymer could be removed with a water wipe.
[3]The material deposited was white or gray in color and could be removed with a water wipe or an isopropyl alcohol wipe. The polymer appeared to be more soluble in isopropyl alcohol.
[4]The material deposited could be removed by wiping with water or isopropyl alcohol.
*A ceramic insert (kit) was used over the surface of portions of the chamber wall Based on the data presented in Table 3, it appeared preferable to use plasmas generated from $Cl_2$ and $N_2$ in combination with the workpiece support platform protective material (and potential internal source of reactive-species-generating material).

Generally, the presence of plasma generated from $Cl_2$ did not cause polymer to deposit on the plasma chamber wall. If either $BCl_3$ or $N_2$ were added to the $Cl_2$, a light contaminant deposition appeared at certain process pressures. If $BCl_3$ and $N_2$ were both used in combination with $Cl_2$, the contaminant deposition could be heavy. When the plasma was generated from $Cl_2/BCl_3$ or $Cl_2/N_2$, the contamination deposition occurred only at the lower operational pressure (about 200 mT).

EXAMPLE 3

The effect of changing the coating on a silicon wafer used to protect the workpiece support platform was also evaluated. Investigation confirmed that a silicon dioxide-coated silicon wafer in the process chamber during plasma cleaning resulted in a slower cleaning rate than achieved when a photoresist-coated (Shipley 1400-33®) silicon wafer was present. Further, with reference to gas distribution plate 106 developed which enabled measurement of volatile metal-containing compositions leaving the process chamber wall during cleaning. This test method makes it possible for one skilled in the art to determine, with minimal experimentation, whether a particular reactive-species-generating source will produce the desired cleaning result.

Prior to the evaluation of each potential reactive-species-generating material, a hand-cleaned (wet solvent wiped) process chamber was used to etch 24 aluminum patterned substrates using a standard aluminum etching process, to build up contaminants of the kind previously described on the process chamber surfaces. After preparation of a contaminant deposited chamber, optical emission spectrum data such as FTIR (Fourier Transfer Infrared Spectra) data can be collected using known techniques, to evaluate various competitive cleaning processes.

Figure 2:
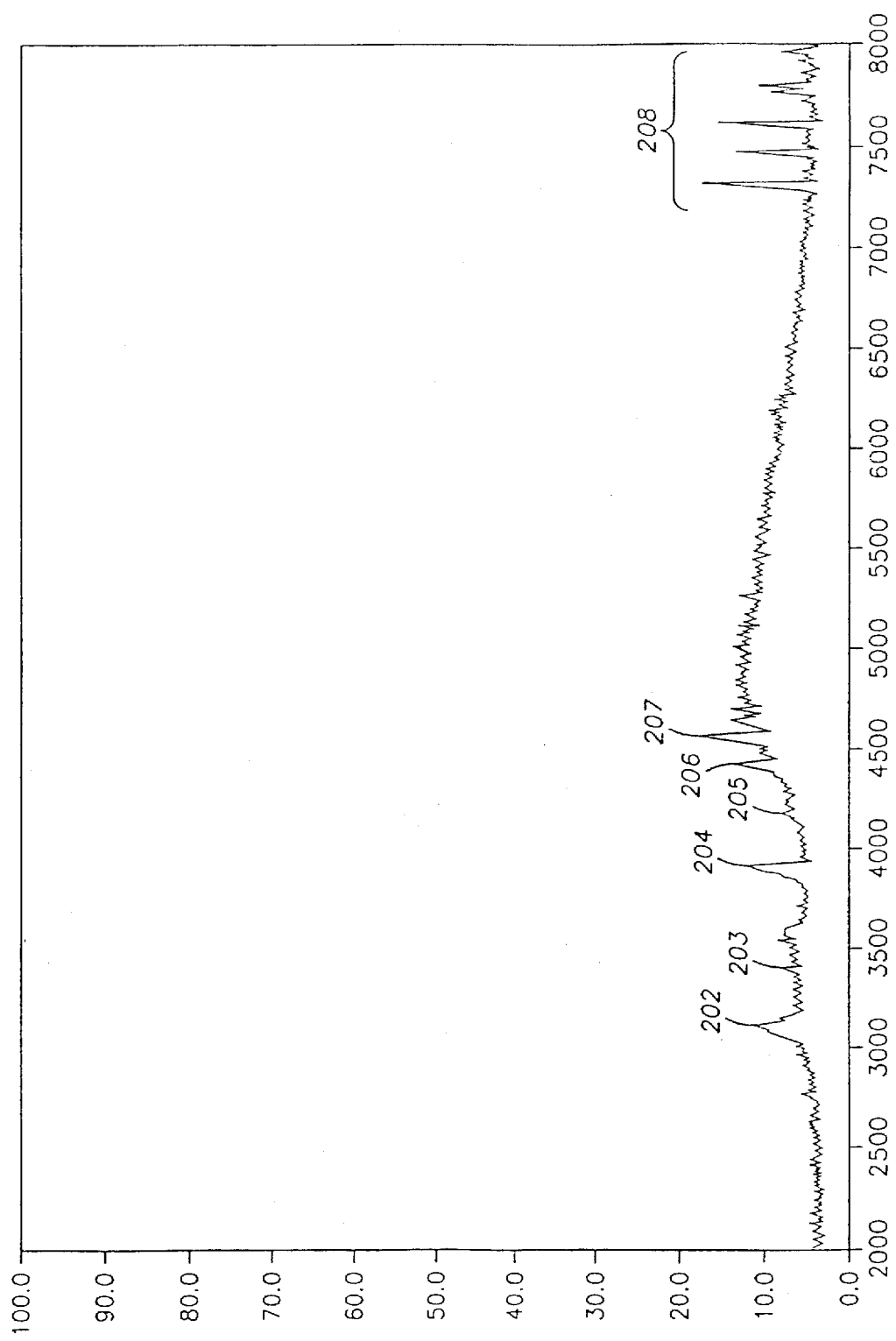
FIG. 2. shows an optical emission spectrum data curve for volatile species adjacent the plasma chamber wall during plasma cleaning of a contaminated plasma chamber. The plasma was generated using 80 sccm $BCl_3$, 80 sccm $Cl_2$, 800 W, 600 mT, and a cathode temperature of about 80° C. An $SiO_2$-coated wafer was used to protect the substrate support platform. The horizontal axis of the curve shows the spectrum wavelength in nanometers (nm) and the vertical axis shows the % of sensitivity for the instrument setting.
Figure 3:
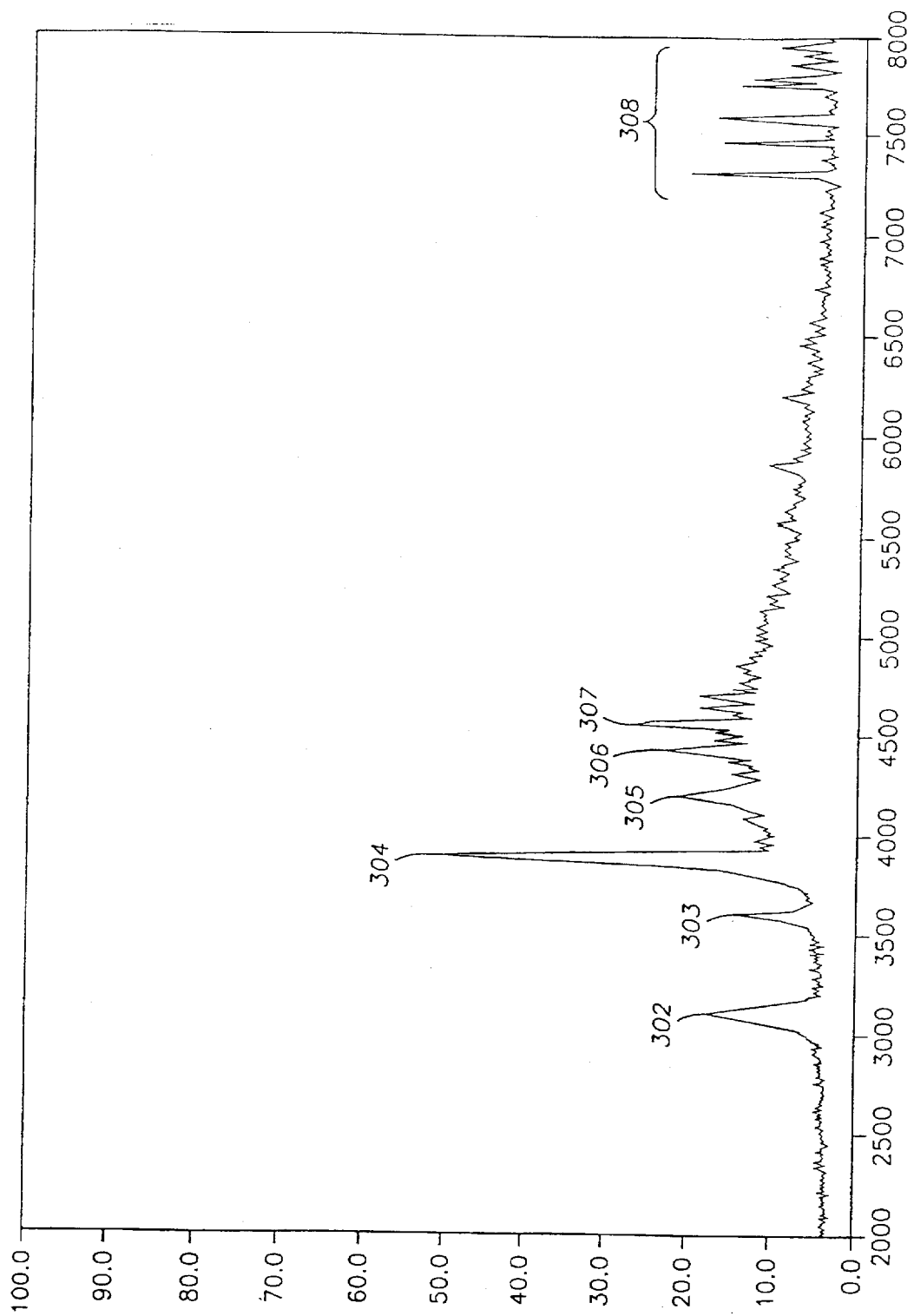
FIG. 3. shows an optical emission spectrum data curve for volatile species adjacent the plasma chamber wall during plasma cleaning of a contaminated plasma chamber. The plasma was generated under the same conditions as those described for FIG. 2, but a potential reactive-species-generating material, a photoresist (Shipley 1400–33®)-coated silicon wafer was used to protect the substrate support platform. The horizontal axis of the curve shows the spectrum wavelength in nm and the vertical axis shows the % of sensitivity for the instrument setting.

FIG. 2 shows an optical emission spectrum data curve for volatile species adjacent the process chamber wall during plasma dry cleaning of a contaminated plasma chamber. The plasma was generated using 80 sccm $BCl_3$, 80 sccm $Cl_2$, 800 W, 600 mT, and a wall operational temperature of about 65° C. The internal source of reactive-species-generating material was an $SiO_2$-coated silicon wafer. FIG. 3 shows an optical emission spectrum data curve for volatile species adjacent the process chamber wall during plasma dry cleaning of a contaminated plasma chamber when the plasma was generated under the same conditions, but when the reactive-species-generating material was a photoresist (Shipley 1400-33®)-coated silicon wafer.

Comparison of FIG. 2 with FIG. 3 shows a significant increase in spectrum peaks in general when the photoresist-coated silicon wafer is used as the reactive-species-generating material. This provides further confirmation of the results described in Example 3; that more rapid cleaning of the plasma chamber surface is occurring when the photoresist-coated silicon wafer is used.

With reference to FIG. 3, the major peaks generated at 303, 304, and 305 are believed to be volatile CN-comprising species, which indicate that polymeric contaminants on the plasma chamber surface are being released.

EXAMPLE 5

This example provides information about the difference in optical emission spectrum data generated when a clean process chamber is plasma dry cleaned versus when a contaminant deposited process chamber is plasma dry cleaned. The contaminant deposited process chamber was prepared in the manner previously described. The plasma was generated from $Cl_2$ gas at a flow rate of about 200 sccm, the power was 800 W, the pressure was about 500 mT, and the wall temperature was about 80° C. The internal source of reactive-species-generating material within the process chamber during dry cleaning was an 8 in. diameter photoresist-coated silicon wafer.

Figure 4:
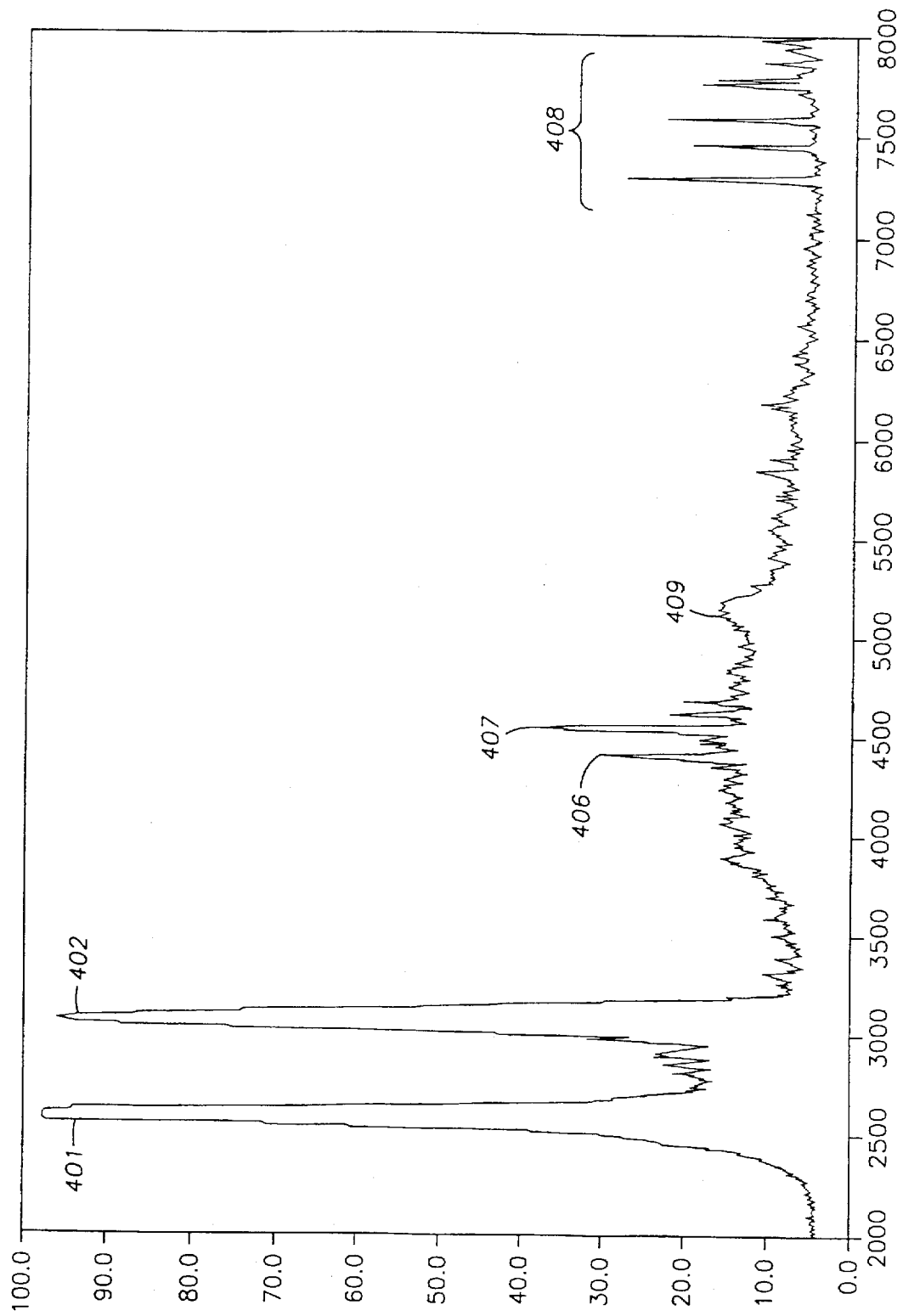
FIG. 4. shows an optical emission spectra data curve for the vapor space adjacent the plasma chamber wall when a clean chamber is plasma cleaned. The plasma was generated from $Cl_2$ gas at a flow rate of about 200 sccm, the power was 800 W, the pressure was about 500 mT, and the temperature was about 80° C. The workpiece support platform was protected using a potential source of reactive-specie-generating material, an 8 in. diameter photoresist-coated silicon wafer. The horizontal axis of the curve shows the spectrum wavelength in nm and the vertical axis shows the % of sensitivity for the instrument setting.
Figure 5:
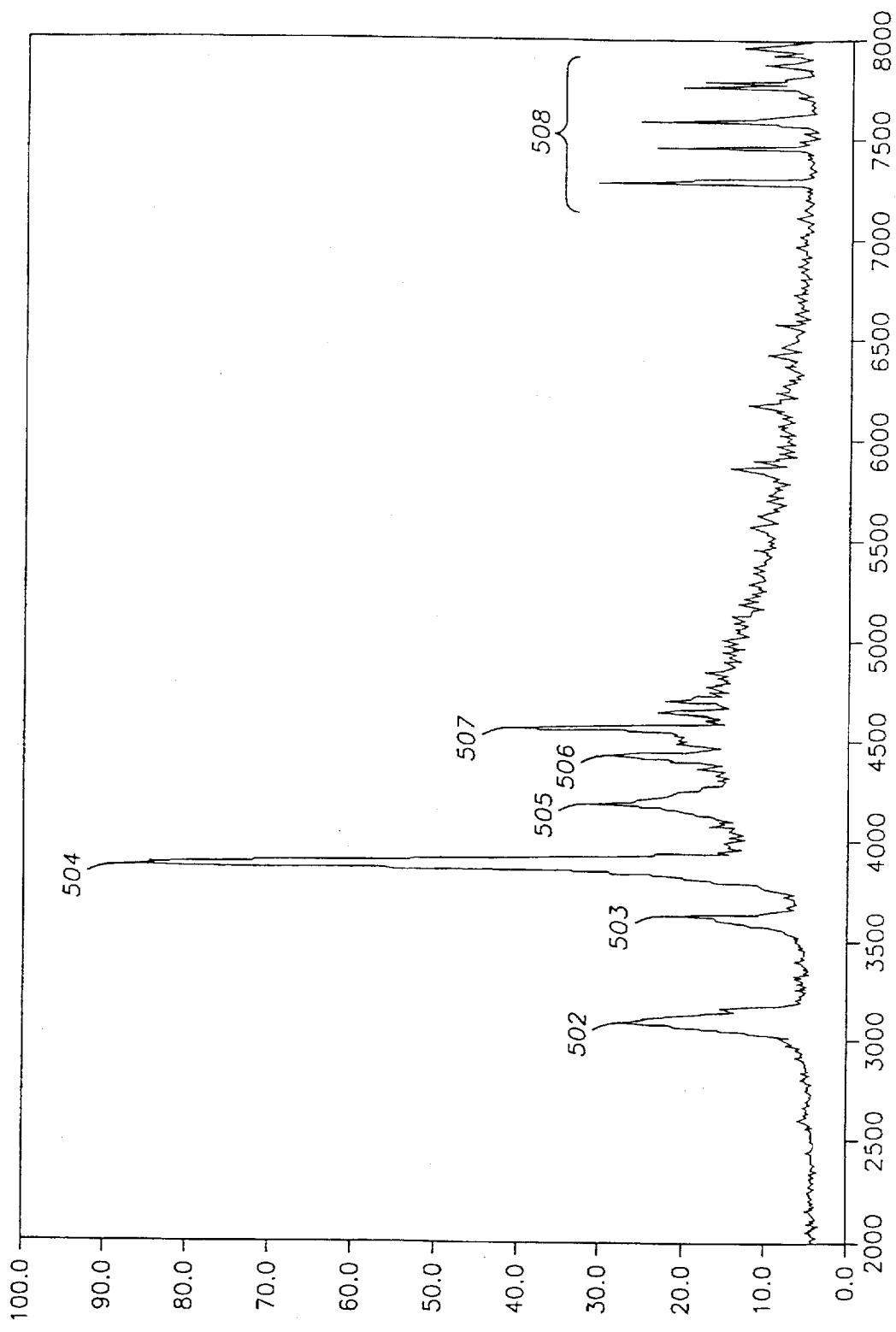
FIG. 5. shows an optical emission spectra data curve for the vapor space adjacent the plasma chamber wall when a contaminant deposited chamber is plasma cleaned. The plasma was generated as described for FIG. 4, and the workpiece support platform was protected using the same potential reactive-species-generating material was the same. The horizontal axis of the curve shows the spectrum wavelength in nm and the vertical axis shows the % of sensitivity for the instrument setting.

FIG. 4 shows the optical emission spectrum data curve for the clean process chamber, and FIG. 5 shows the optical emission spectrum data curve for the contaminant deposited process chamber. The appearance in FIG. 5 of major peaks at 503, 504 and 505 which are not present in FIG. 4 indicate the formation of a new volatile compound not formed when a clean chamber is treated. These peaks are located at the same spectrum as peaks 303, 304, and 305, which have been attributed to volatile CN-containing molecules, evidently formed from polymeric molecules on the contaminated plasma chamber surface which are being released in large quantities.

The optical emission spectrum appearing in FIG. 4 at 401 and 402 may be reactive species generated by the reactive-species-generating material which find no contaminant on the process chamber surface to act upon and which are not present in FIG. 5 because they are consumed during the cleaning process. (Alternatively, the equivalent peaks may be missing from FIG. 5 because the optical window was not clean enough.)

Various materials useful for protecting the workpiece support platform in a manner which enhances the cleaning activity of reactive plasma species at the process chamber wall and internal sources of reactive-species-generating materials can be evaluated using the technique described above. With minimal experimentation, one skilled in the art can determine the effectiveness of a particular species generating source in assisting the removal of contaminants from process chamber surfaces.

The above-described preferred embodiments of the present invention are not intended to limit the scope of the present invention as demonstrated by the claims which follow, as one skilled in the art can, with minimal experimentation, extend the disclosed concepts of the invention to the claimed scope of the invention.

What is claimed is:

1. A reactive species useful in plasma cleaning of semiconductor processing chambers, wherein said reactive species is generated by exposing a non-metallic carbon-comprising material, which is a liquid or a solid under standard conditions of about 25° C. and atmospheric pressure, to a plasma, wherein the suitability of said reactive species for cleaning of process chambers is determined by measuring the removal rate of involatile deposits from the surface of said process chamber.

2. A material useful in plasma cleaning of semiconductor processing chambers, said material comprising: a non-metallic, carbon-comprising material which is a liquid or a solid under standard conditions of about 25° C. and atmospheric pressure and which reduces the consumption of dry cleaning reactive species at the location of said non-metallic, carbon-comprising material during said cleaning of said semiconductor processing chamber, wherein the suitability of said non-metallic, carbon-comprising material for reducing the consumption of plasma-generated dry cleaning reactive species is determined by measuring the consumption rate of such dry cleaning reactive species at the location of said non-metallic, carbon-comprising material.

3. The reactive species of claim 1, or claim 22, or claim 23, or claim 24, or claim 25, wherein said non-metallic, carbon-comprising material from which said species is generated is in a form which can occupy the space typically occupied by a workpiece in a semiconductor processing chamber.

4. The reactive species of claim 3, wherein said non-metallic carbon-comprising material from which said species is generated is in the form of a solid disk or sheet.

5. The reactive species of claim 4, wherein said non-metallic carbon-comprising material from which said species is generated is in the form of a coating upon a non-reactive-species-generating substrate.

6. The reactive species of claim 1, wherein said non-metallic, carbon-comprising material from which said species is generated is formed from an organic carbon-containing compound.

7. The reactive species of claim 1, wherein said non-metallic, carbon-comprising material from which said species is generated is formed from a polymeric material.

8. The reactive species of claim 7, wherein said non-metallic, carbon-comprising material is formed from a material selected from the group consisting of polyimides, phenol formaldehyde novalac resins, and polymers generated using $CHF_3$ as a starting material, and combinations thereof.

9. The reactive species of claim 7, wherein said polymeric material comprises a phenol formaldehyde novalac resin in combination with a diazoquinone sensitizer.

10. The carbon-comprising material of claim 2, wherein said non-metallic, carbon-comprising material occupies the space typically occupied by a workpiece in a semiconductor processing chamber.

11. The non-metallic, carbon-comprising material of claim 2 or claim 10, wherein said carbon-comprising material is in the form of a solid disk or sheet.

12. The non-metallic, carbon-comprising material of claim 2 or claim 10, wherein said carbon-comprising material is in the form of a coating upon a non-reactive-species-generating substrate.

* * * * *

UNITED STATES PATENT AND TRADEMARK OFFICE

CERTIFICATE OF CORRECTION

PATENT NO. : 5,753,137

INVENTOR(S) : Yan Ye et al.

DATED : May 19, 1998

It is certified that error appears in the above-identified patent and that said Letters Patent is hereby corrected as shown below:

Delete Claim 3 in its entirety and replace with the following:

3. The reactive species of claim 1, or claim 6, or claim 7, or claim 8, or claim 9, wherein said non-metallic, carbon-comprising material from which said species is generated is in a form which can occupy the space typically occupied by a workpiece in a semiconductor processing chamber.

Signed and Sealed this

First Day of September, 1998

*Attest:*

*Attesting Officer*

BRUCE LEHMAN

*Commissioner of Patents and Trademarks*

UNITED STATES PATENT AND TRADEMARK OFFICE
CERTIFICATE OF CORRRECTION

PATENT NO. : 5,753,137
DATED : May 19, 1998
INVENTOR(S) : Ye et al.

It is certified that error appears in the above-identified patent and that said Letters Patent is hereby corrected as shown below:

ON THE TITLE PAGE:
Item [56] References Cited, the following references as listed should be added under U.S. Patent Documents and Foreign Patent Documents.

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 4 | 5 | 1 | 3 | 4 | 9 | 05/29/84 | James T. Yeh | | | |
| | | | | | | | | | | | | | |

FOREIGN PATENT DOCUMENTS

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | EP | A | 41 | 6 | 4 | 0 | 0 | 03/13/91 | Makoto Nagashima | | | | |
| | | | | | | | | | | | | | | |

Signed and Sealed this

Twentieth Day of April, 1999

Attest:

Attesting Officer

Q. TODD DICKINSON

Acting Commissioner of Patents and Trademarks